(12) United States Patent
Baba et al.

(10) Patent No.: US 6,815,869 B2
(45) Date of Patent: Nov. 9, 2004

(54) SURFACE ACOUSTIC WAVE DEVICE

(75) Inventors: Toshiyuki Baba, Moriyama (JP); Masashi Omura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 62 days.

(21) Appl. No.: 10/321,769

(22) Filed: Dec. 18, 2002

(65) Prior Publication Data

US 2003/0146677 A1 Aug. 7, 2003

(30) Foreign Application Priority Data

Dec. 18, 2001 (JP) .......................................... 2001-384930
Oct. 25, 2002 (JP) .......................................... 2002-311271

(51) Int. Cl.[7] .............................................. H01L 41/08
(52) U.S. Cl. .................................................. 310/313 R
(58) Field of Search ........................ 310/313 R, 313 B, 310/313 C, 313 D

(56) References Cited

U.S. PATENT DOCUMENTS

| | | | | |
|---|---|---|---|---|
| 4,734,608 A | * | 3/1988 | Takoshima ............... | 310/313 R |
| 5,459,368 A | * | 10/1995 | Onishi et al. ............ | 310/313 R |
| 5,699,027 A | * | 12/1997 | Tsuji et al. ................. | 333/193 |
| 5,920,142 A | * | 7/1999 | Onishi et al. ............ | 310/313 R |
| 5,969,461 A | * | 10/1999 | Anderson et al. ........ | 310/313 R |
| 6,078,123 A | * | 6/2000 | Tanaka et al. .......... | 310/313 R |
| 6,150,748 A | * | 11/2000 | Fukiharu ................. | 310/313 R |
| 6,534,901 B1 | * | 3/2003 | Tsuzuki et al. .............. | 310/348 |

FOREIGN PATENT DOCUMENTS

JP 08-265096 10/1996

* cited by examiner

Primary Examiner—Mark Budd
(74) Attorney, Agent, or Firm—Keating & Bennett LLP

(57) ABSTRACT

A surface acoustic wave device includes a surface acoustic wave element mounted on a substrate, and the surface acoustic wave element is sealed by a resin sealing layer. Even when the size of the surface acoustic wave element is reduced, a short circuit in a mounting electrode is prevented from occurring when it is mounted, a fillet formation of a conductive bond in the mounting can be easily and visually checked, and the cost can be reduced. The surface acoustic wave element is mounted on a multi-layered substrate by a face-down mounting method by using bumps, the surface acoustic wave element is sealed by the resin sealing layer, electrode lands on an upper surface of the multi-layered substrate connected to the bumps are connected to internal electrodes through via hole electrodes, and the internal electrodes are electrically connected to the mounting electrodes on a lower surface of the multi-layered substrate and end surface wiring electrodes.

17 Claims, 12 Drawing Sheets

SURFACE ACOUSTIC WAVE DEVICE

BACKGROUND OF THE INVENTION

1. Field of the Invention

The present invention relates to a surface acoustic wave device having a structure in which a surface acoustic wave element is bonded to a substrate by a face-down mounting method, and more specifically, the present invention relates to a surface acoustic wave device having an improved structure including a substrate with a surface acoustic wave element laminated thereon.

2. Description of the Related Art

Miniaturization and low profile of a surface acoustic wave device accommodating a surface acoustic wave element has been strongly required of surface acoustic wave devices. To meet these requirements, a structure in which the surface acoustic wave element is bonded on the substrate via a bump, with a surface having an electrode for the surface acoustic wave element such as an IDT formed thereon defining a lower surface, i.e., a structure in which the surface acoustic wave element is mounted on the substrate by a so-called face-down mounting method, has been proposed.

In addition, the surface acoustic wave device accommodating the surface acoustic wave element and having an airtight or liquid-tight sealing structure has been required so as to stabilize the characteristics thereof, and so as to be less susceptible to fluctuations in the environment.

Japanese Unexamined Patent Application Publication No. 8-265096 discloses an example of the surface acoustic wave device of this type. In this example, the surface acoustic wave element is mounted on the substrate via the bump by the face-down mounting method, and, in order to seal the surface acoustic wave element, a metal cap is fixed to an upper surface of the substrate so as to surround the surface acoustic wave element. In addition, the surface acoustic wave element is bonded to the substrate also by insulating resin, and the bonding strength of the surface acoustic wave element to the substrate is increased. In order to prevent any flow casting of this insulating resin to the electrode side of the surface acoustic wave element, a guard layer is disposed on the upper surface of the substrate outside the surface acoustic wave element.

However, in the device disclosed in this Japanese patent publication, because the metal cap must be bonded to the substrate by using adhesive, etc. as described above, the number of parts is increased, and the assembly is complicated.

On the other hand, another structure has been known, in which the surface acoustic wave element is sealed in an airtight or liquid-tight manner by mounting the surface acoustic wave element on the substrate by the face-down mounting method, and sealing the surface acoustic wave element with resin except for a surface of the surface acoustic wave element having the electrode disposed thereon. In such a device, a metal cap need not be prepared separately, and an assembly process can be simplified.

FIG. 7 is a sectional view showing an example of a conventional surface acoustic wave device having a resin sealing layer. In a surface acoustic wave device 101, a surface acoustic wave element 103 is mounted on a substrate 102, and a resin sealing layer 104 is arranged so as to surround the surface acoustic wave element 103. Electrode lands 102a and 102b are disposed on an upper surface of the substrate 102. Via hole electrodes 102c and 102d are formed in the substrate 102 in a piercing manner through the substrate 102. Upper ends of the via hole electrodes 102c and 102d are connected to the electrode lands 102a and 102b. In addition, mounting electrodes 102e and 102f are disposed on a lower surface of the substrate 102 so that the surface acoustic wave device 101 is mounted on a printed circuit board, etc. A shield ring 102g is disposed on the substrate 102 so as to provide an electromagnetic shield effect.

On the other hand, a schematically shown electrode 103a for the surface acoustic wave element is disposed on a lower surface of the surface acoustic wave element 103. Bump pads 103b and 103c on the lower surface of the surface acoustic wave element 103 and the electrode lands 102a and 102b are connected to each other via metal bumps 105 and 106.

In the surface acoustic wave device 101, mounting electrodes 102e and 102f are disposed on the lower surface of the substrate 102. The surface acoustic wave device 101 is surface-mounted on a printed circuit board or other substrate by using the mounting electrodes 102e and 102f.

FIG. 8 is a sectional view of another example of a conventional surface acoustic wave device of this type.

In a surface acoustic wave device 111 shown in FIG. 8, unlike the surface acoustic wave device 101, a substrate with the surface acoustic wave element 103 mounted thereon is a multi-layered substrate 112. This means that the multi-layered substrate 112 has electrode lands 112a and 112b on an upper surface thereof in a manner similar to the substrate 102. Via hole electrodes 112c and 112d are formed within the multi-layered substrate 112. However, via hole electrodes 112c and 112d are formed in the multi-layered substrate 112 so that lower ends of the via hole electrodes 112c and 112d reach the position of the middle height of the substrate 112, and connected to internal electrode 112e and 112f. Via hole electrodes 112g and 112h are formed on lower surfaces of the internal electrodes 112e and 112f. The distance between the via hole electrodes 112g and 112h is larger than the distance between the via hole electrodes 112a and 112b.

In addition, the via hole electrodes 112g and 112h are arranged so as to reach the lower surface of the substrate 112, and connected to mounting electrodes 112i and 112j disposed on the lower surface thereof.

FIG. 9 is a sectional view of yet another example of a conventional surface acoustic wave device of this type. In a surface acoustic wave device 121, electrode lands 122a and 122b are disposed on an upper surface of a substrate 122, and mounting electrodes 122c and 122d are disposed on a lower surface thereof. The electrode lands 122a and 122b on the upper surface and the mounting electrodes 122c and 122d on the lower surface are electrically connected to each other via the end surface electrodes 122e and 122f disposed on the other side of the substrate 122.

In order to reduce the size and the cost of a surface acoustic wave device, it is necessary to obtain as many surface acoustic wave elements as possible from one wafer. Thus, the cutting margin when cutting individual surface acoustic wave elements out of the wafer is reduced, or the size of the surface acoustic wave elements themselves is reduced.

When the size of the surface acoustic wave elements is reduced, the distance between bump pads for bonding the surface acoustic wave elements via bumps is reduced. This means that surface bump pads 131a to 131d are disposed in a surface acoustic wave element 131 shown in FIG. 10.

Electrodes for surface acoustic wave elements such as IDTs are also formed on a surface with the bump pads 131a to 131d disposed thereon although this is not shown in FIG. 10.

It is assumed that the surface acoustic wave element 131 is square in plan view, the length of one side is a, and the distance between bump pads is c. It is assumed that the size of the surface acoustic wave element 131 is reduced to obtain a surface acoustic wave element 132 shown in FIG. 11. In this occasion, the length b of one side of the surface acoustic wave element 132 is smaller than the length a, and similarly, the distance d between the bump pads 132a to 132d is liable to be shorter than the distance c shown in FIG. 10.

As described above, if the size of the surface acoustic wave element is reduced, the distance between the bumps must be smaller when the surface acoustic wave element is bonded on the substrate via bumps by the face-down mounting method. For example, if the size of the surface acoustic wave element 101 shown in FIG. 7 is reduced, a surface acoustic wave device 141 shown in FIG. 12 is obtained, and the distance d between bumps in the surface acoustic wave device 141 must be smaller than the distance between the bumps 105 and 106 in the surface acoustic wave device 101 shown in FIG. 7. Thus, in the surface acoustic wave device 141, the distance between the mounting electrodes 102e and 102f is reduced, and a short circuit can occur during the mounting.

On the other hand, in the surface acoustic wave device 111 including the multi-layered substrate 112 shown in FIG. 8, the distance between the mounting electrodes 112e and 112f can be sufficiently large by setting the distance between the via hole electrodes 112g and 112h therebelow to be larger than the distance between the via hole electrodes 112c and 112d even when the size of the surface acoustic wave element 103 is reduced. However, in the surface acoustic wave device 111, the mounting electrodes 112e and 112f are disposed on the lower surface of the multi-layered substrate 112, and any fillet formation in a solder-bonded portion to the printed circuit board or substrate cannot be checked. Therefore, defective mounting cannot be discovered rapidly.

On the other hand, in the surface acoustic wave device 121 shown in FIG. 9, the electrode lands 122a and 122b on an upper surface of the substrate 122 and the mounting electrodes 122c and 122d on the lower surface of the substrate are electrically connected to each other by using the end surface electrodes 122e and 122f. Thus, any fillet formation at an end surface can be visually checked when the surface acoustic wave device 121 is soldered to the printed circuit board or substrate.

However, since the electrode lands 122a and 122b are extended to the exterior of the resin sealing layer 104, and bonded to the end surface electrodes 122e and 122f, any shield ring or the like defining an electromagnetic shield structure cannot be disposed on the upper surface of the substrate 122. In addition, a problem occurs in that the sealability of the interface between the resin sealing layer 104 and the substrate 122 is degraded.

SUMMARY OF THE INVENTION

In order to overcome the problems described above, preferred embodiments of the present invention provide a surface acoustic wave device which solves the above-described problems of the prior art, and has a surface acoustic wave element mounted on a substrate by a face-down mounting method, can be easily surface-mounted on a printed circuit board or other substrate even when the surface acoustic wave device has a resin sealing layer, has a greatly reduced size of the surface acoustic wave element, is constructed to facilitate easy checking of any fillet formation, prevents any generation of a short circuit or other such defect and disadvantage, and increases versatility in wiring an electromagnetic shield ring or the like.

A surface acoustic wave device according to a preferred embodiment of the present invention includes a surface acoustic wave element having first and second main surfaces facing each other and a plurality of end surfaces connecting the first and second main surfaces, and an electrode for the surface acoustic wave element and a bump pad for electric connection to the exterior on the first main surface, and a substrate having an electrode land joined with the bump pad of the surface acoustic wave element via a bump, and a resin sealing layer arranged so as to cover the surface acoustic wave element such that the surface acoustic wave element is joined with an upper surface of the substrate from the first main surface side via the bump, and the surface acoustic wave element is spaced from the upper surface of the substrate, the substrate includes a multi-layered substrate, the multi-layered substrate includes a via hole electrode in which one end thereof is connected to the electrode land provided on the upper surface of the multi-layered substrate, an internal electrode connected to the via hole electrode, a mounting electrode provided on a lower surface of the multi-layered substrate, and an end surface wiring electrode with which the electrode for mounting and the internal electrode are connected at an end surface of the multi-layered substrate.

According to another preferred embodiment of the present invention, the surface acoustic wave device further includes a protective layer which is disposed on the first main surface of the surface acoustic wave element to protect the electrode for the surface acoustic wave element and a frame member which surrounds a portion including the electrode for the surface acoustic wave element to prevent flow of a resin constituting the resin sealing layer.

According to yet another preferred embodiment of the present invention, the sealing resin is a thermosetting resin or a photosensitive resin.

According to still another preferred embodiment of the present invention, the multi-layered substrate is preferably made of ceramic or synthetic resin, or other suitable material.

According to further still another preferred embodiment of the present invention, a shield ring is provided on the upper surface of the multi-layered substrate so as to surround a portion on which surface acoustic wave element is mounted.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, specific preferred embodiments of the present invention will be described with reference to drawings.

Figure 1:
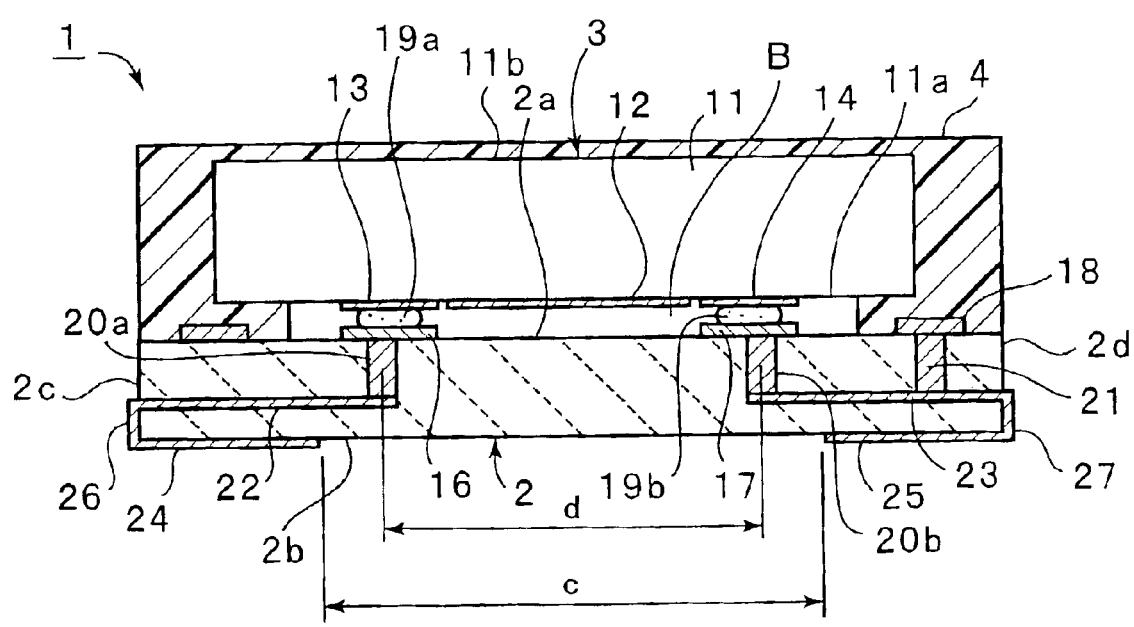
FIG. 1 is a frontal sectional view of a surface acoustic wave device according to a first preferred embodiment of the present invention.

FIG. 1 is a sectional view of a surface acoustic wave device according to a first preferred embodiment of the present invention. A surface acoustic wave device 1 preferably includes a multi-layered substrate 2, and a surface acoustic wave element 3 bonded on the multi-layered substrate 2 via a bump. The periphery of the surface acoustic wave element 3 is preferably covered by a resin sealing layer 4.

The surface acoustic wave element 3 has a surface acoustic wave substrate 11. The surface acoustic wave substrate 11 has a structure in which a piezoelectric thin film is disposed on a piezoelectric substrate or an insulation substrate, or a structure in which a piezoelectric thin film is further disposed on a piezoelectric substrate.

The surface acoustic wave substrate 11 has first and second main surfaces 11a and 11b. An electrode 12 for constituting the surface acoustic wave element 3 such as an IDT is disposed on the first main surface 11a. The structure of the electrode 12 is determined according to the targeted surface acoustic wave element, and not limited in the present invention.

On the other hand, in the surface acoustic wave element 3, bump pads 13 and 14 are provided on the first main surface 11a. The bump pads 13 and 14 are electrically connected to an electrode 12 for the surface acoustic wave element, and also constitute a portion to be bonded to the substrate via the bump pads 13 and 14.

Figure 2:
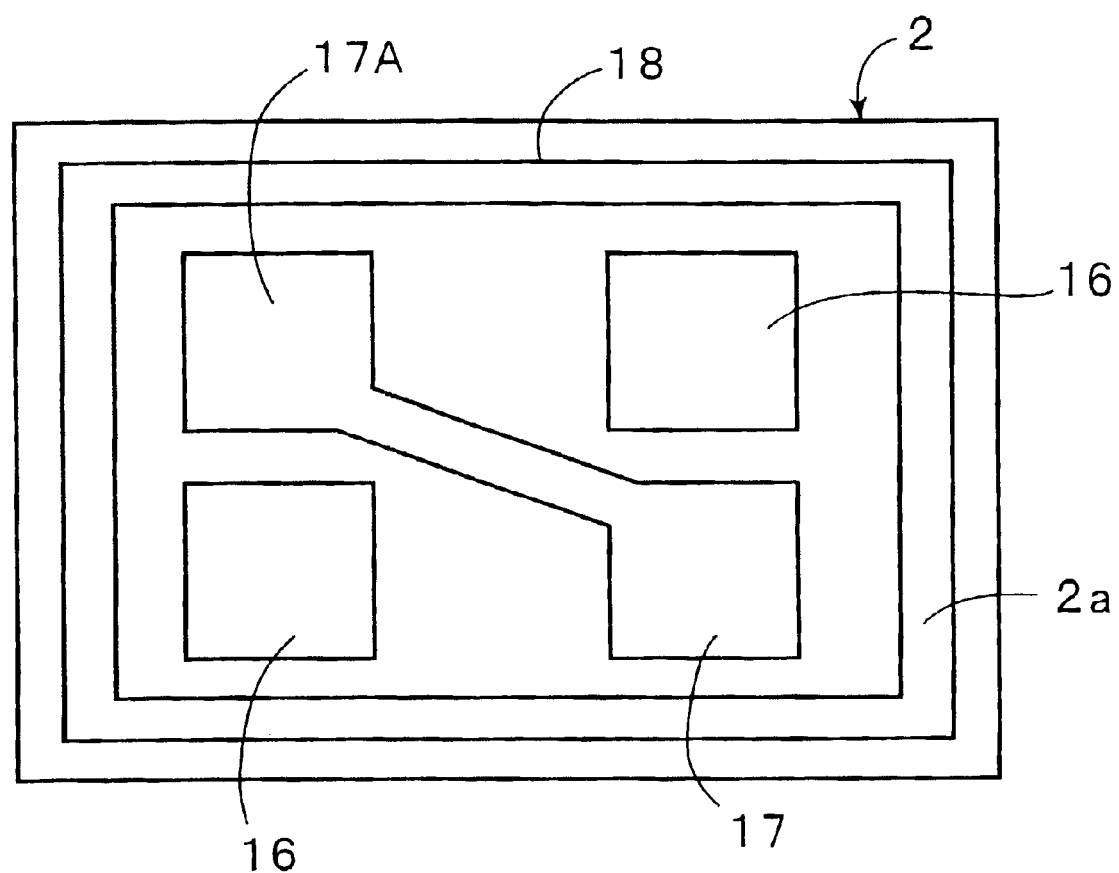
FIG. 2 is a plan view of a multi-layered substrate used in the surface acoustic wave device according to the first preferred embodiment of the present invention.

In the present preferred embodiment, the multi-layered substrate 2 is preferably formed of ceramic, but it may be formed of synthetic resin or other suitable material. Electrodes 16 and 17 are disposed on an upper surface 2a of the multi-layered substrate 2. In addition, a shield ring 18 in plan view of FIG. 2 is disposed on the upper surface 2a of the multi-layered substrate 2. The shield ring 18 includes a substantially rectangular frame that is preferably formed of the same conductive material as that of the electrodes 16 and 17. Of course, the shield ring 18 may be formed of a conductive material that is different from that of the electrodes 16 and 17. The shield ring 18 is arranged so as to perform electromagnetic shielding of the interior of the shield ring 18.

The electrodes 16 and 17 are electrically connected to bumps 19a and 19b as shown in the figure. This means that the surface acoustic wave element 3 is bonded to the electrodes 16 and 17 via the bumps 19a and 19b, and mounted on the multi-layered substrate 2.

On the other hand, via hole electrodes 20a and 20b leading from the upper surface 2a to the position of the middle height of the multi-layered substrate 20 are formed on the multi-layered substrate 2. Upper ends of the via hole electrodes 20a and 20b are electrically connected to the electrodes 16 and 17. In addition, an upper end of the via hole electrode 21 is electrically connected to the shield ring 18 so that the via hole electrode 21 is formed in a similar manner to the via hole electrodes 20a and 20b.

Internal electrodes 22 and 23 are disposed in the multi-layered substrate 2 at the position of the middle height. The internal electrode 22 is electrically connected to a lower end of the via hole electrode 20a, and the internal electrode 23 is electrically connected to lower ends of the via hole electrodes 20b and 21. The internal electrodes 22 and 23 are extended to end surfaces 2c and 2d facing each other of the multi-layered substrate 2. Mounting electrodes 24 and 25 are disposed on a lower surface 2b of the multi-layered substrate 2. The mounting electrodes 24 and 25 are electrically connected to the internal electrodes 22 and 23 via end surface wiring electrodes 26 and 27 respectively disposed on the end surfaces 2c and 2d.

Figure 3:
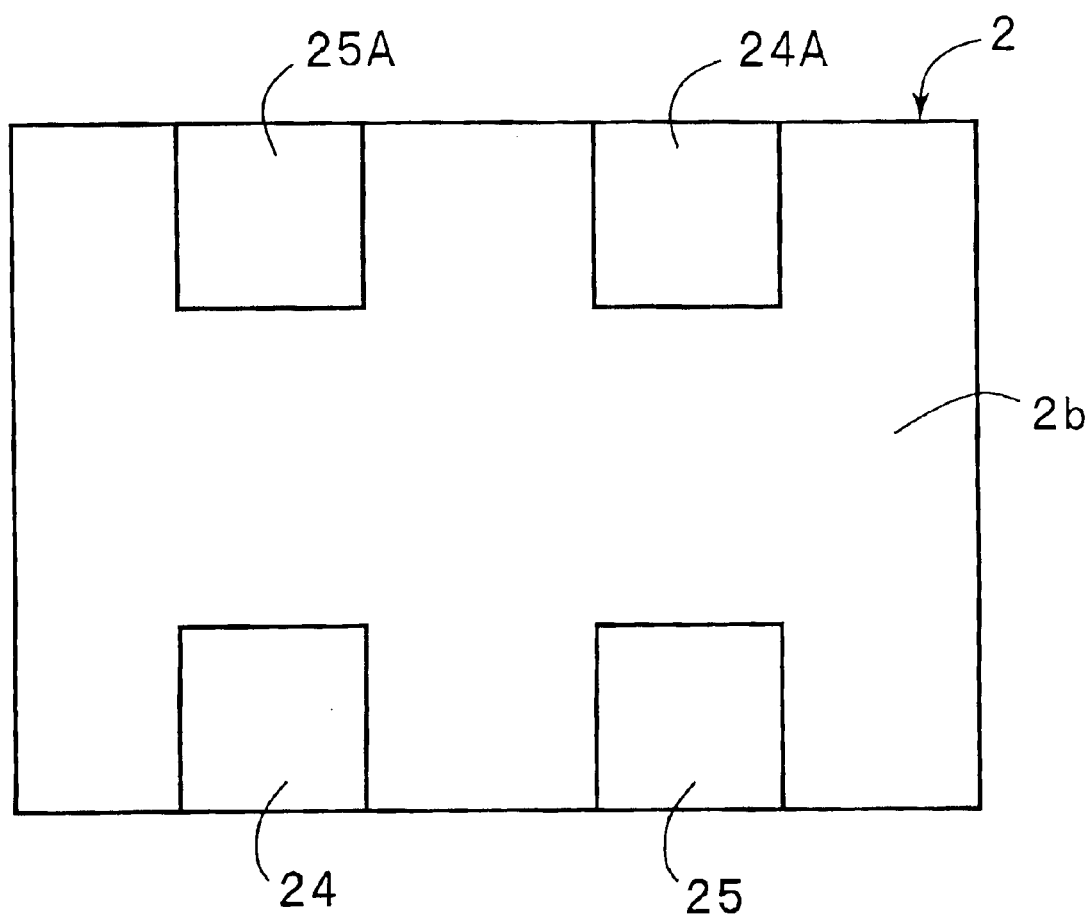
FIG. 3 is a bottom plan view of the multi-layered substrate used in the surface acoustic wave device according to the first preferred embodiment of the present invention.

FIG. 1 shows a structure of a portion at which the pair of electrode lands 16 and 17 are electrically connected to the pair of mounting electrodes 24 and 25, and as shown in FIG. 2, four electrodes 16 and 17, 16A and 17A are disposed on the upper surface of the multi-layered substrate 2. Among these electrode lands, the electrode lands 17 and 17A are connected to the ground potential, and electrically connected to the upper surface 2a of the multi-layered substrate 2 via a connection electrode 31. In addition, as shown in FIG. 3, four mounting electrodes 24, 25, 24A and 25A are disposed on the lower surface 2b of the multi-layered substrate 2.

Electric connection of the mounting electrodes 24A and 25A to the electrode lands 16A and 17A is similar to that shown in FIG. 1.

In the surface acoustic wave device 1 according to the present preferred embodiment, in order to prevent any oscillation of a portion having the electrode 12 for the surface acoustic wave element of the surface acoustic wave element 3, the surface acoustic wave element 3 is mounted on the multi-layered substrate 2 via the bumps 19a and 19b so as to provide a space B between the first main surface 11a of the surface acoustic wave element 3 and the multi-layered substrate 2. The bumps 19a and 19b can be formed of suitable metals, such as Au and solder. The resin sealing layer 4 is disposed so as to seal the space B.

A material for constituting the resin sealing layer 4 is not specifically limited, but a thermosetting resin and a photosensitive resin are preferably used. If the resin sealing layer 4 is formed of a thermosetting resin, the resin sealing layer 4 can be rapidly cured when heated, and the resin sealing layer 4 with excellent mechanical strength can be constituted. If the resin sealing layer 4 is formed of a photosensitive resin, and cured by irradiating the light, the resin sealing layer 4 can be formed without heating the surface acoustic wave element 3.

In the surface acoustic wave device 1 according to the present preferred embodiment, the distance between the adjacent bumps 19a and 19b and the distance d between the via hole electrodes 20a and 20b are reduced when the size of the surface acoustic wave element 3 is reduced. However, the internal electrodes 22 and 23 are extended to the end surfaces 2c and 2d, and electrically connected to the mounting electrodes 24 and 25 via the end surface wiring electrodes 26 and 27, and thus, the distance between the mounting electrodes 24 and 25c can be larger than the distance between the bump pads. Therefore, short circuits or other defects or disadvantages are prevented from occurring between the adjacent mounting electrodes 24 and 25 when mounting the surface acoustic wave device 1 on a printed circuit board or other suitable substrate.

In addition, since the end surface wiring electrodes 26 and 27 are provided, fillet formation can be visually checked easily and rapidly when the surface acoustic wave device is mounted on a printed circuit board by soldering, or other suitable process.

In addition, sealability of the space B is also improved since the resin sealing layer 4 is bonded to the upper surface 2a of the multi-layered substrate 2 in a closed annular area.

Due to the presence of the shield ring 18, the space B, i.e., a portion including the electrode 12 for the surface acoustic wave element, the bumps 10 and 11, etc. is electromagnetically shielded from the exterior, and are therefore prevented from being affected by the external electromagnetic wave, etc.

Figure 4:
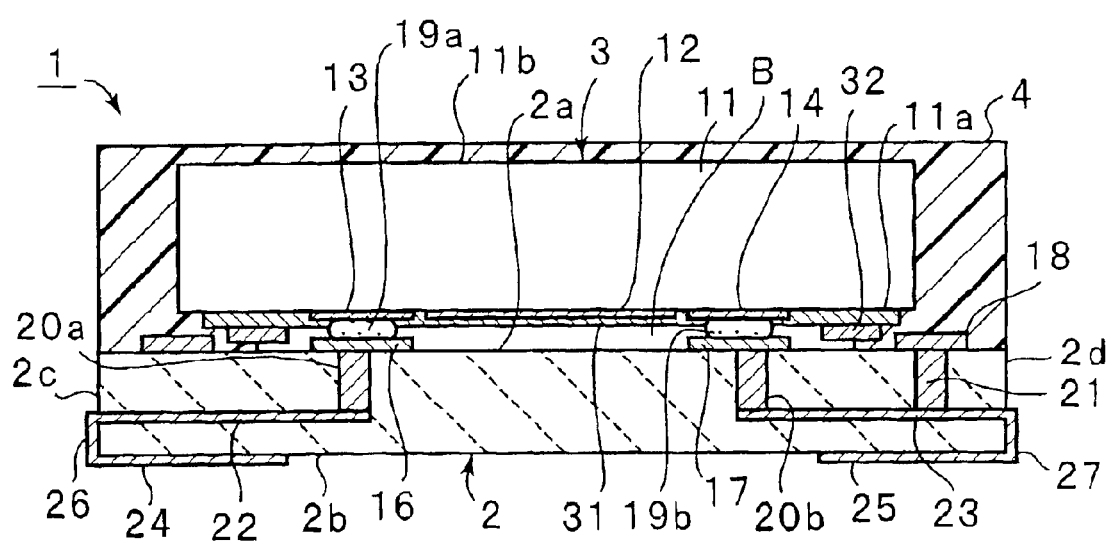
FIG. 4 is a frontal sectional view of the surface acoustic wave device according to a modification of a preferred embodiment of the present invention.

As shown in a modification in FIG. 4, a protective layer 31 may be arranged so as to cover at least a portion including the electrode for the surface acoustic wave element 12 of the surface acoustic wave element 3. The protective layer 31 including a silicon compound such as silicon nitride and silicon oxide may be used, and the moisture resistance of the surface acoustic wave element 3 can be improved.

As shown in FIG. 4, a frame-shaped dam 32 may be formed on the first main surface 11a of the surface acoustic wave element 3 so as to prevent the resin constituting the resin sealing layer 4 from flowing into the space B side. The material constituting the frame-shaped dam 32 is not specifically limited, but thermosetting resin such as polyimide, epoxy and silicone, and a photosensitive resin, or a metal such as solder may be used.

Figure 5:
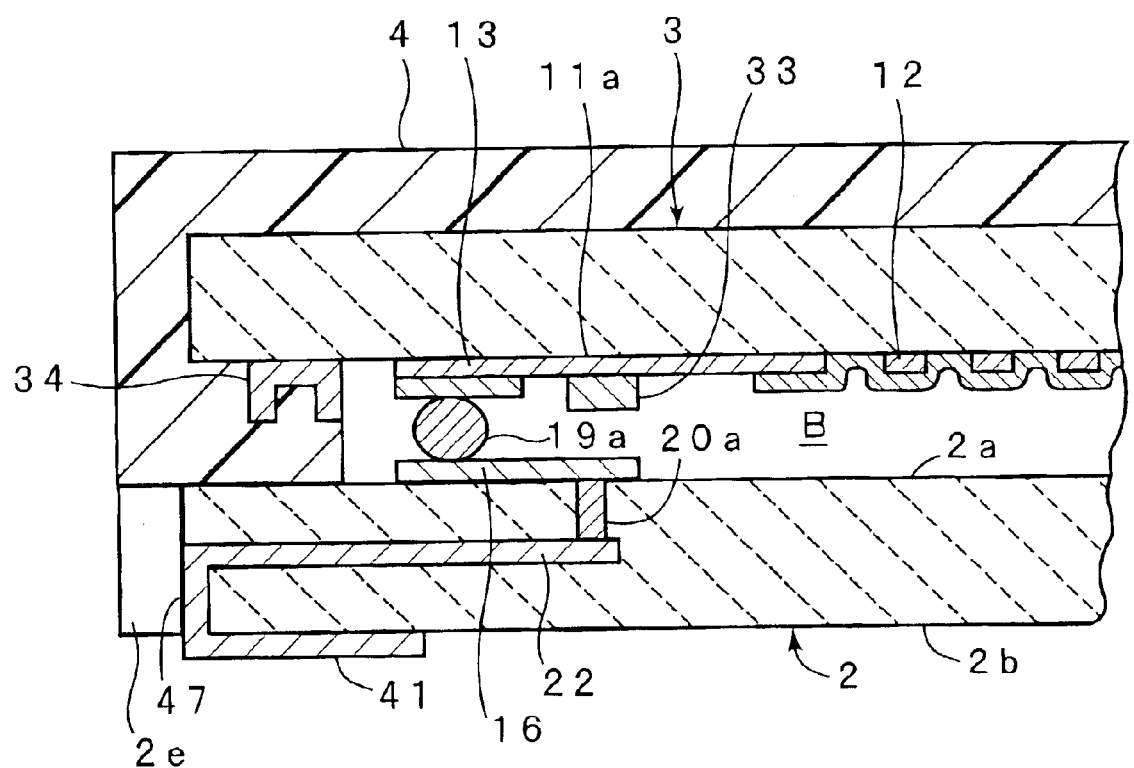
FIG. 5 is a fragmentary frontal cross-sectional and broken view for describing another modification of a preferred embodiment of the surface acoustic wave device of the present invention.
Figure 6:
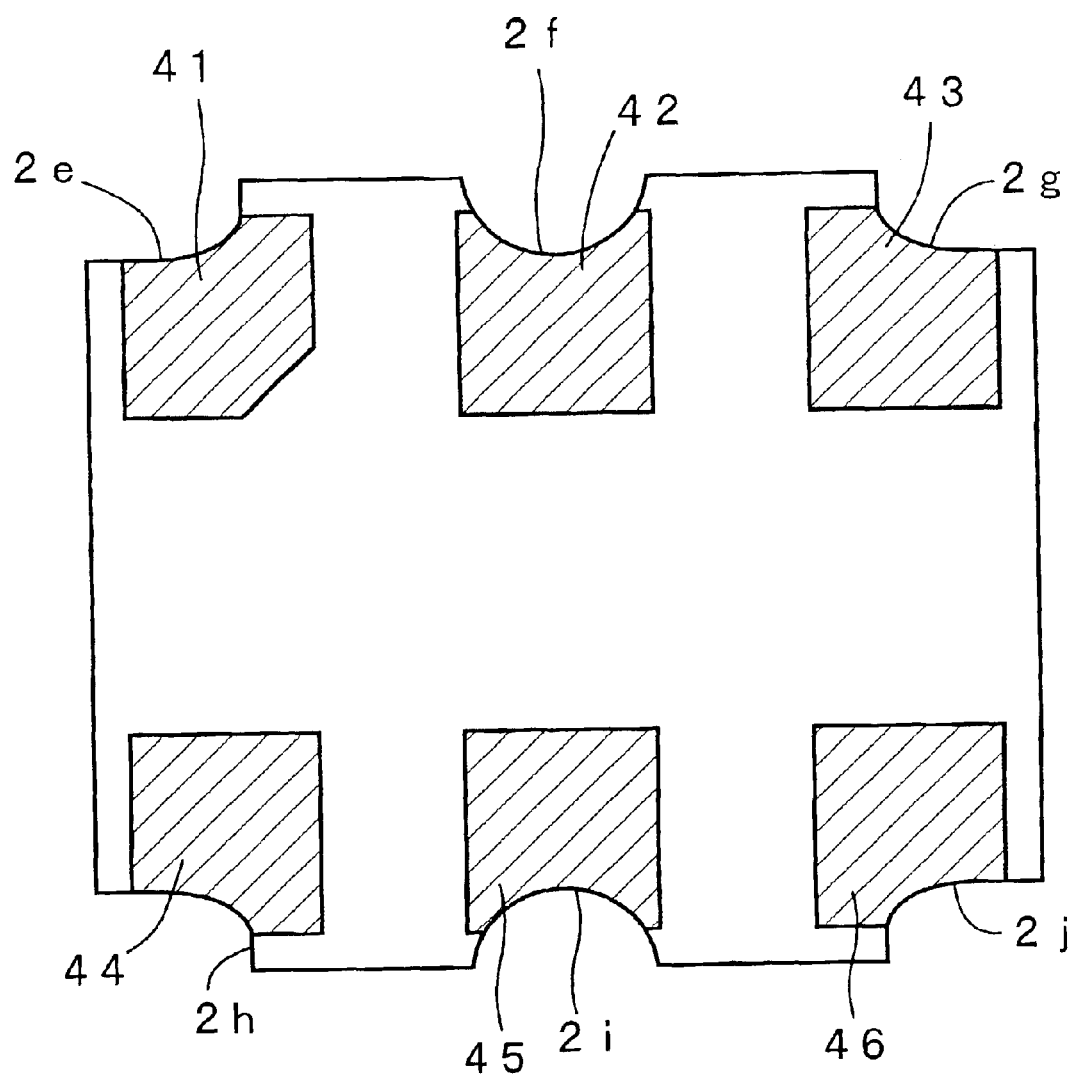
FIG. 6 is a bottom plan view of the surface acoustic wave device according to another modification a preferred embodiment shown in FIG. 5.
Figure 7:
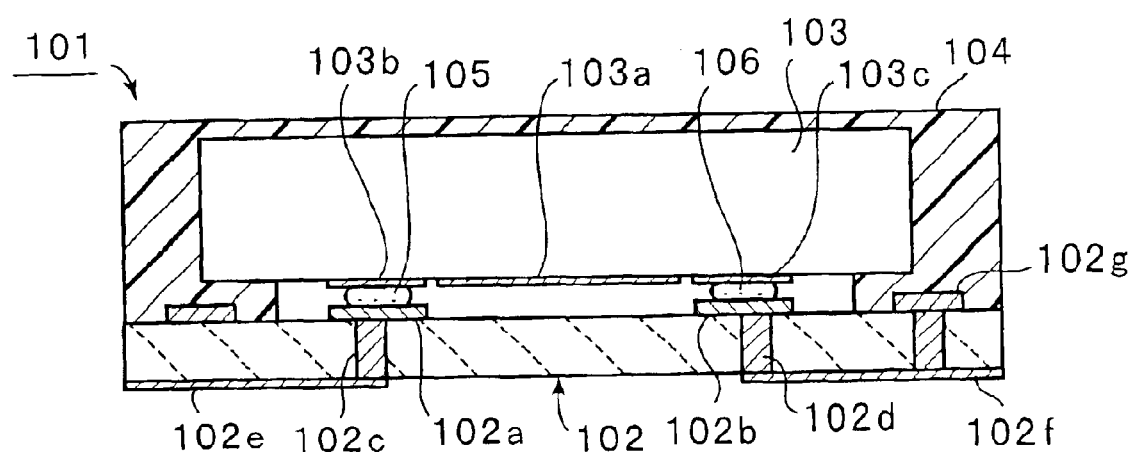
FIG. 7 is a frontal sectional view of an example of a conventional surface acoustic wave device.
Figure 8:
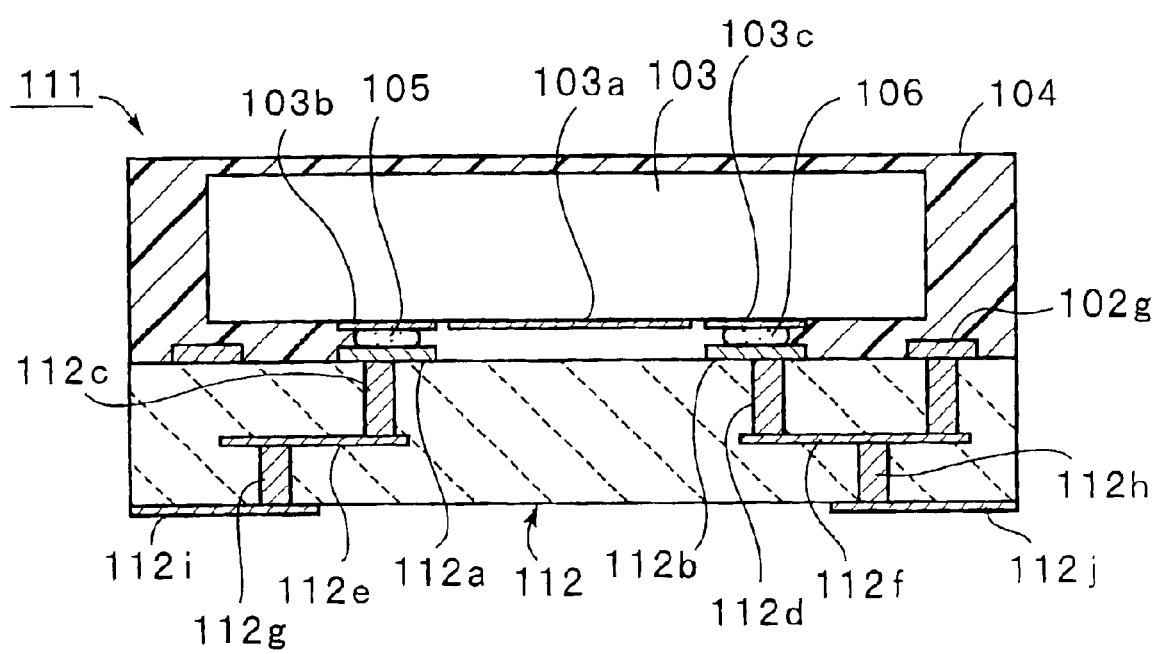
FIG. 8 is a frontal sectional view of another example of the conventional surface acoustic wave device.
Figure 9:
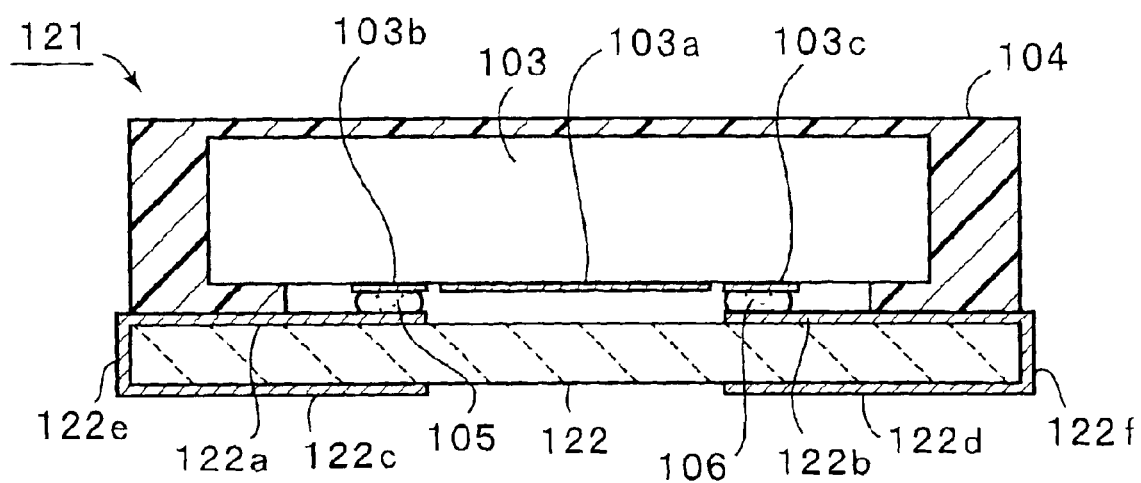
FIG. 9 is a frontal sectional view of yet another example of the conventional surface acoustic wave device.
Figure 10:
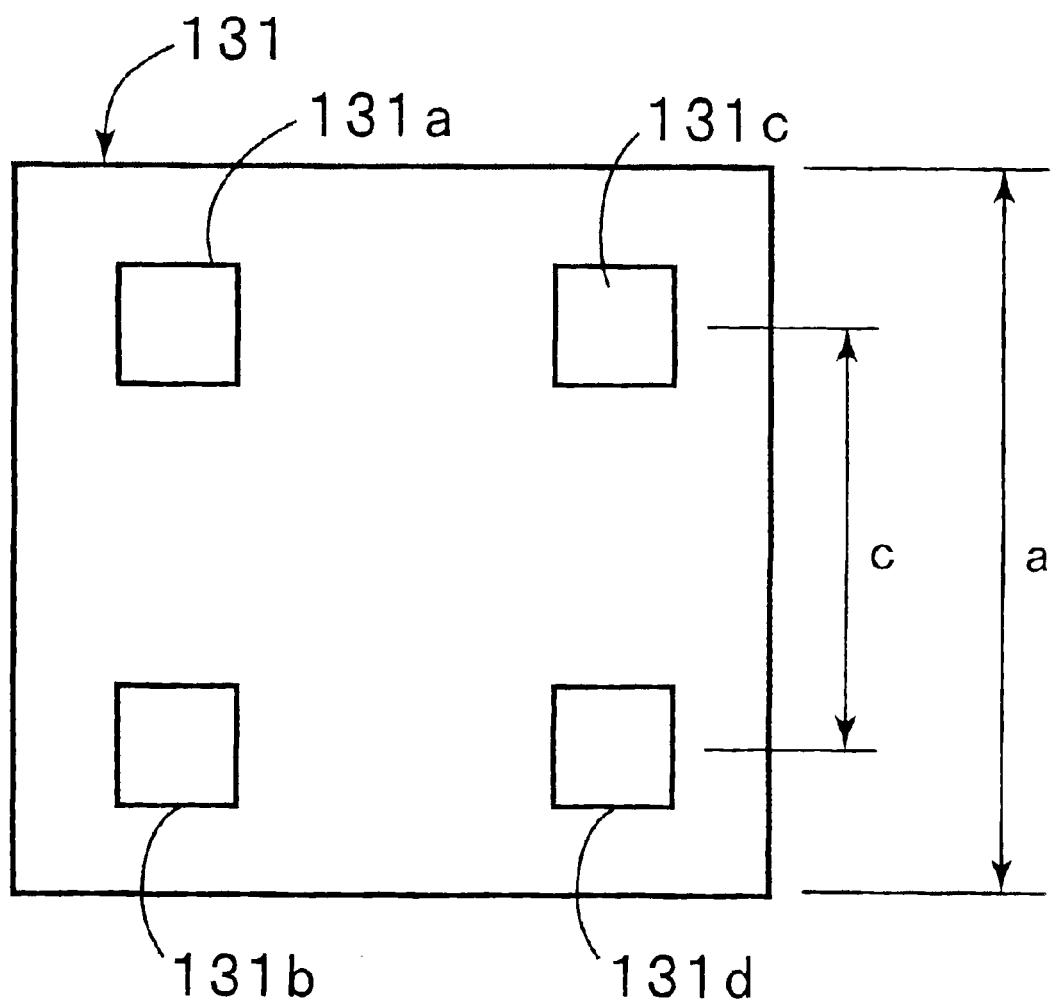
FIG. 10 is a bottom plan view for describing a bump pad disposed on a lower surface of the surface acoustic wave element included in the conventional surface acoustic wave device.
Figure 11:
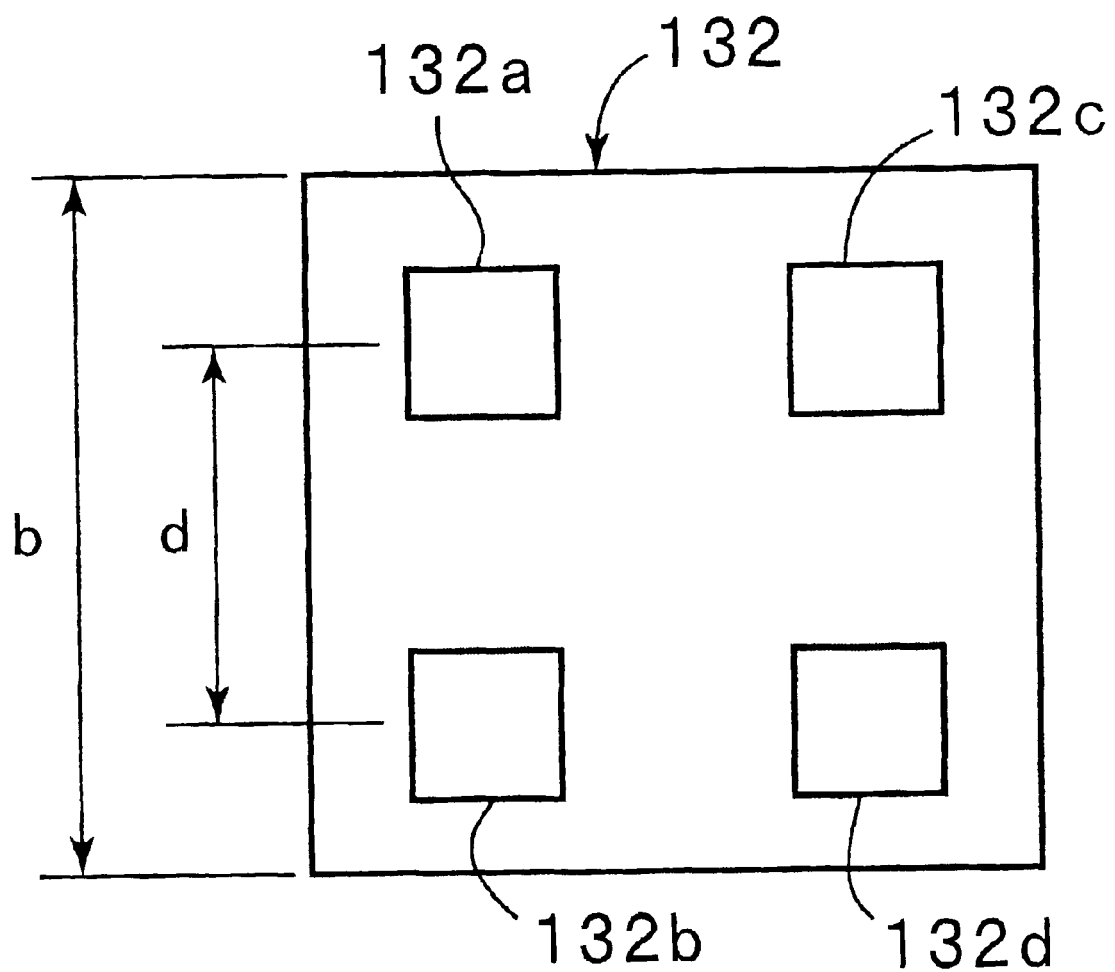
FIG. 11 is a bottom plan view for describing a bump pad disposed on a lower surface of the surface acoustic wave element when the size of the surface acoustic wave element is reduced.
Figure 12:
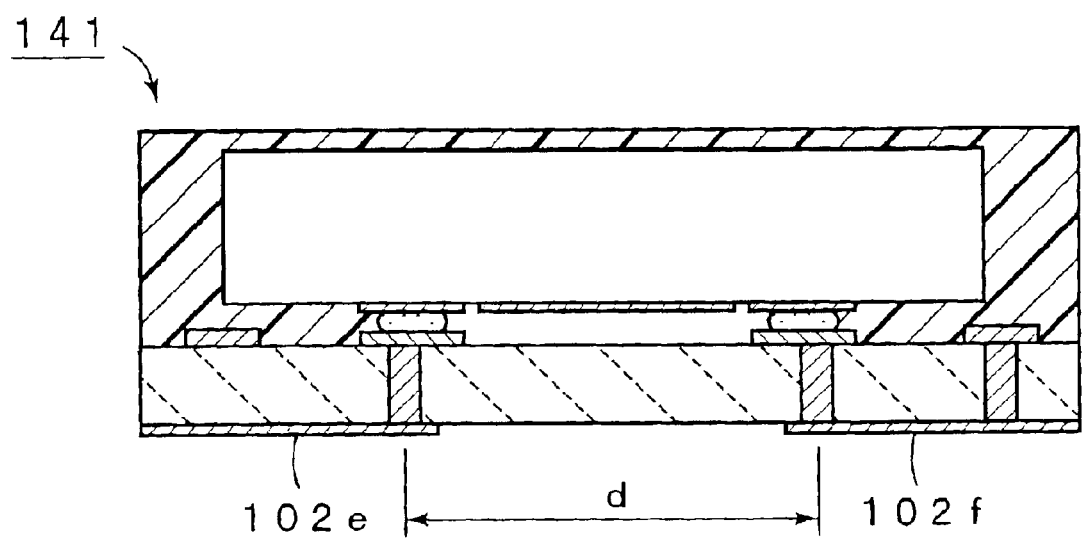
FIG. 12 is a frontal sectional view for describing problems when the size of the conventional surface acoustic wave device shown in FIG. 7 is reduced.

FIGS. 5 and 6 are fragmentary frontal cross-sectional and broken view and a bottom plan view of still another modification of the surface acoustic wave device of preferred embodiments of the present invention, respectively. In the modification shown in FIG. 4, the frame-shaped dam 32 is arranged to prevent the resin from flowing in the space B side. In this preferred embodiment of the present invention, a plurality of frame-shaped dams may be disposed.

In the modification shown in FIG. 5, an inner dam 33 and an outer dam 34 are provided. This means that a plurality of surface acoustic wave filters and surface acoustic wave resonators are constituted on the first main surface 11a of the surface acoustic wave element 3 though not shown in FIGS. 5 and 6. The inner dam 33 is arranged so as to surround a portion including each surface acoustic wave filter and each surface acoustic wave resonator. The outer dam 34 is formed on the first main surface 11a so as to surround an entire area including the plurality of surface acoustic wave filter and surface acoustic wave resonators.

As described above, by providing both the inner dam 33 and the outer dam 34, the resin constituting the resin sealing layer 4 can be reliably prevented from flowing in the space B, in particular, in a portion including each surface acoustic wave filter and each surface acoustic wave resonator therein.

As shown in FIG. 6, in the surface acoustic wave device according to the modification of preferred embodiments of the present invention, a plurality of mounting electrodes 41 to 46 are disposed on the lower surface of the multi-layered substrate 2. The mounting electrodes 41 to 46 are arranged to extend from the lower surface of the multi-layered substrate 2 leading to notches 2e to 2j made in a side surface of the multi-layered substrate 2. The mounting electrode 41, as a representative, is connected to the internal electrode 22 disposed in the multi-layered substrate 2 via the end surface wiring electrode 47 formed in the notch 2e. As described above, the notches 2e to 2j may be provided in the side surface of the multi-layered substrate 2, and the end surface wiring electrode may be formed in the notches 2e to 2j.

In the surface acoustic wave device of preferred embodiments of the present invention, the surface acoustic wave element is bonded on the multi-layered substrate via the bumps by the face-down mounting method, and in the surface acoustic wave device having the resin sealing layer so as to cover the surface acoustic wave device, the via hole electrodes are disposed with one end thereof bonded to the electrode lands disposed on the upper surface of the multi-layered substrate and bonded to the bumps, the internal electrode connected to the via hole and the mounting electrode formed on the lower surface of the multi-layered substrate are electrically connected to the end surface wiring electrode formed on the end surface of the multi-layered substrate, and the distance between the mounting electrodes can be sufficiently increased even when the size of the surface acoustic wave element is reduced. Therefore, when the surface acoustic wave device is mounted on a printed circuit board or the like by soldering, etc., any short circuit between the adjacent mounting electrodes can be reliably prevented, and fillet formation can be easily and visually checked.

Since the size of the surface acoustic wave element is significantly reduced, a large number of surface acoustic wave elements can be obtained from one wafer, and the cost of the surface acoustic wave elements can be reduced, and accordingly, the cost of the surface acoustic wave device can be reduced.

As a result, a compact surface acoustic wave device having excellent sealability and resistance to any short circuit in the mounting can be provided at a low cost.

In preferred embodiments of the present invention, when the protective film is formed on the first main surface of the surface acoustic wave element, moisture resistance of the surface acoustic wave element can be improved, and when the frame-shaped member is arranged so as to surround a portion including the electrode for the surface acoustic wave element, the flow-in of the resin constituting the resin sealing layer is prevented, and non-defective ratio of the surface acoustic wave device can be increased.

If a thermosetting resin is used in the resin sealing layer, the resin sealing layer can be rapidly formed when heated, and the resin sealing layer of excellent strength can be obtained. If the resin sealing layer is formed of a photosensitive resin, and cured by light irradiation, the resin sealing layer can be formed without any risk of thermal shock being applied to the surface acoustic wave element.

When the multi-layered substrate is formed of ceramic, the multi-layered substrate having the internal electrode can be easily obtained by a ceramic-integrated baking technology. In addition, the multi-layered substrate may be constituted by using a synthetic resin, and in such a case, the cost of the multi-layered substrate can be reduced by using an inexpensive synthetic resin film laminate.

If the shield ring is disposed on an upper surface of the multi-layered substrate, the electrode for the surface acoustic wave element or substrate can be electromagnetically shielded, and the surface acoustic wave device having much more stable characteristics can be provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a surface acoustic wave element having first and second main surfaces facing each other and a plurality of end surfaces connecting the first and second main surfaces, and having an electrode and a bump pad for electrical connection to an exterior on the first main surface;
   a substrate having an electrode land joined with the bump pad of the surface acoustic wave element via a bump; and
   a resin sealing layer arranged so as to cover said surface acoustic wave element such that said surface acoustic wave element is joined with an upper surface of said substrate from the first main surface side via the bump, and said surface acoustic wave element is spaced from said upper surface of the substrate; wherein
   said substrate includes a multi-layered substrate including an upper surface, a lower surface and two side surface connecting the upper surface and the lower surface;
   said multi-layer substrate includes a via hole electrode in which one end thereof is connected to said electrode land provide on the upper surface of the multi-layer substrate, said via hole electrode does not extend to the lower surface of the multi-layer substrate;
   an internal electrode provided inside of said multi-layered substrate and connected to said via hole electrode;
   a mounting electrode provided on the lower surface of said multi-layered substrate; and
   an end surface wiring electrode extends along atleast one of the two side surfaces of the multi-layered substrate and is connected to said mounting electrode and said internal electrode at said at least one of the two side surfaces of the multi-layer substrate.

2. A surface acoustic wave device according to claim 1, further comprising:
   a protective layer which is disposed on the first main surface of the surface acoustic wave element to protect the electrode for the surface acoustic wave element; and
   a frame member which surrounds a portion including the electrode for the surface acoustic wave element to prevent flow of a resin constituting the resin sealing layer.

3. A surface acoustic wave device according to claim 1, wherein said resin sealing layer is made one of a thermosetting resin and a photosensitive resin.

4. A surface acoustic wave device according to claim 1, wherein said multi-layered substrate is made of one of ceramic and synthetic resin.

5. A surface acoustic wave device according to claim 1, wherein a shield ring is arranged on the upper surface of said multi-layered substrate so as to surround a portion on which the surface acoustic wave element is mounted.

6. A surface acoustic wave device according to claim 5, wherein the shield ring has a substantially rectangular frame configuration.

7. A surface acoustic wave device according to claim 5, wherein the shield ring is made of the same material as that of the electrode of the surface acoustic wave element.

8. A surface acoustic wave device according to claim 5, wherein the shield ring is made of a different material than that of the electrode land of the surface acoustic wave element.

9. A surface acoustic wave device according to claim 1, wherein the surface acoustic wave element includes a surface acoustic wave substrate that includes one of a piezoelectric substrate and an insulation substrate, and a piezoelectric film disposed on said one of a piezoelectric substrate an insulation substrate.

10. A surface acoustic wave device according to claim 1, wherein the multi-layered substrate has a plurality of via hole electrodes extending from the upper surface thereof to a middle height of the multi-layered substrate.

11. A surface acoustic wave device according to claim 1, wherein a plurality of bumps are provided between the first main surface of the surface acoustic wave element and the multi-layered substrate so as to define a space therebetween.

12. A surface acoustic wave device according to claim 11, wherein the resin sealing layer is arranged to seal the space between the first main surface of the surface acoustic wave element and the multi-layered substrate.

13. A surface acoustic wave device according to claim 11, wherein there are a plurality of internal electrodes provided in the multi-layered substrate and the plurality of internal electrodes are extended to the end surfaces of the multi-layered substrate.

14. A surface acoustic wave device according to claim 1, wherein a plurality of the bump pads are provided on the surface acoustic wave element and a plurality of the mounting electrodes are provided on the multi-layered substrate, wherein a distance between the plurality of mounting electrodes is larger than a distance between the plurality of bump pads.

15. A surface acoustic wave device according to claim 1, wherein a portion including the electrode of the surface acoustic wave element and the solder bump is electromagnetically shielded from an exterior thereof.

16. A surface acoustic wave device according to claim 1, wherein the multi-layered substrate has notches formed in a side surface thereof and includes a plurality of the mounting electrodes, wherein the mounting electrodes are arranged to extend from the lower surface of the multi-layered substrate to the notches.

17. A surface acoustic wave device according to claim 1, wherein the end surface wiring electrode does not extend to the upper surface of the multi-layered substrate.

* * * * *